United States Patent [19]

Kano et al.

[11] Patent Number: 4,795,658

[45] Date of Patent: Jan. 3, 1989

[54] METHOD OF METALLIZING CERAMIC MATERIAL

[75] Inventors: Osamu Kano; Atsuo Senda, both of Nagaokakyo, Japan

[73] Assignee: Murata Manufacturing Co., Ltd., Japan

[21] Appl. No.: 18,591

[22] Filed: Feb. 25, 1987

[30] Foreign Application Priority Data

Mar. 5, 1986 [JP] Japan ................................. 61-49063

[51] Int. Cl.$^4$ ................................................ B05D 5/12
[52] U.S. Cl. ...................................... 427/98; 427/229; 427/305; 427/307; 427/383.5; 427/443.1
[58] Field of Search .............. 427/98, 229, 307, 305, 427/383.5, 443.1

[56] References Cited

U.S. PATENT DOCUMENTS

| | | | |
|---|---|---|---|
| 3,212,917 | 10/1965 | Tsu | 427/305 |
| 3,690,921 | 9/1972 | Elmore | 427/305 |
| 4,066,809 | 1/1978 | Alpaugh | 427/305 |
| 4,328,048 | 5/1982 | Senda et al. | |
| 4,402,494 | 9/1983 | Senda et al. | |
| 4,448,804 | 5/1984 | Amelio | 427/98 |
| 4,464,422 | 8/1984 | Senda et al. | |
| 4,552,787 | 11/1985 | Chebiniak | 427/305 |

*Primary Examiner*—Shrive Beck
*Assistant Examiner*—Vi Duong Dang
*Attorney, Agent, or Firm*—Ostrolenk, Faber, Gerb & Soffen

[57] ABSTRACT

A method of metallizing a ceramic material by forming a metal thin film through electroless plating, chemically etching the metal thin film after heat treatment and metallizing the surface of the ceramic material through electroless plating after the etching.

11 Claims, No Drawings

METHOD OF METALLIZING CERAMIC MATERIAL

BACKGROUND OF THE INVENTION

1. Field of the Invention

The present invention relates to a method of metallizing the surface of a ceramic material through electroless plating, and more particularly, it relates to an improvement in a pretreatment process previous to metallization.

2. Description of the Prior Art

In order to provide electrodes on a ceramic electronic component, the surface of the ceramic material is metallized through electroless plating as disclosed in U.S. Pat. Nos. 4,328,048, 4,402,494 and 4,464,422, for example. In advance of such metallization, the ceramic surface is generally etched so that a metal thin film is uniformly and strongly adhered to the ceramic surface. In general, such etching is chemically performed through an aqueous solution of nitric acid, sulfuric acid, hydrofluoric acid or the like.

In another conventional method of metallizing a ceramic material, an activating paste containing a metallic salt of Pd or the like is coated on the ceramic surface and baked, and then subjected to electroless plating.

However, when pretreatment is performed through the strong acid in the first mentioned conventional method of metallizing a ceramic material, vapor containing the strong acid tends to gather in the circumference with increase in concentration of the strong acid, thereby causing corrosion of peripheral apparatuses and environmental pollution. Further, ceramic material is not easily etched even if strong acid of high concentration is employed, and hence the etching process must be performed at a high temperature for a long time.

Such problems are particularly serious in metallization of etching-resistant ceramic materials such as $ZrO_2$-$TiO_2$-$SnO_2$ ceramics.

In the case of the last-mentioned conventional method, a coaxial type ceramic material structure, employed in a dielectric resonator for example, is so complicated in configuration that coating of the paste is difficult, leading to uneven coating and increase in the working time.

SUMMARY OF THE INVENTION

Accordingly, an object of the present invention is to provide a method of metallizing the surface of a ceramic material, in which pretreatment can be performed in a short time and with readily increased adhesion strength without employing dangerous chemicals for a long time.

The method of metallizing the ceramic surface according to the present invention comprises a step of forming a metal thin film on the ceramic surface through electroless plating, a step of subsequently performing heat treatment on the metal thin film, a step of chemically etching the metal thin film and a step of metallizing the ceramic surface through electroless plating after the etching.

DESCRIPTION OF THE INVENTION

The present invention is applicable to $ZrO_2$-$TiO_2$-$SnO_2$ ceramics, as hereinafter described with reference to a disclosed Example of the invention. It is also applicable to etching-resistant ceramics such as $Al_2O_3$ and any other ceramics.

The material for forming a metal thin film on the ceramic surface can be prepared from material capable of electroless plating, such as copper or nickel.

The metal thin film is about 0.05 to 0.5 $\mu$m, preferably about 0.3 $\mu$m in thickness. It is difficult to metallize a ceramic material smaller than 0.05 $\mu$m in thickness. If the said thickness is in excess of 0.5 $\mu$m, on the contrary, blistering takes place as the metal thin film grows.

After formation of the metal thin film, heat treatment is performed in an oxidizing, neutral or reducing atmosphere in order to adhere, diffuse or react the metal thin film to, in or with the ceramic material. With respect to an easily reduced ceramic material, the heat treatment is preferably performed in an oxidizing atmosphere. The heat treatment is performed within a temperature range of 900° to 1200° C., preferably at a temperature of about 1000° C.

For example, dilute hydrochloric acid, dilute nitric acid or an aqueous solution of hydrofluoric acid can be employed to chemically etch the metal thin film at a temperature lower than 100° C. in a short time of about 10 minutes.

Metallization upon the etching is performed through electroless plating similarly to the conventional method. Therefore, the description in U.S. Pat. No. 4,464,422 is hereby incorporated by reference. After the electroless plating, a metal thin film may be formed by electrolytic plating.

According to the present invention, a metal thin film is formed on the ceramic surface in advance of metallization. Then the metal thin film is chemically etched to facilitate the subsequently performed metallization.

When a ceramic surface itself is chemically etched to form a metal film of considerable thickness as in the conventional case, adhesion strength is so small that blistering is caused with increase in the film thickness, while such a problem can be solved by the present invention. Namely, the chemical etching can be performed in a short time without employing highly concentrated strong acid. Thus, acid of low concentration such as dilute nitric acid, dilute hydrochloric acid and an aqueous solution of hydrofluoric acid can be employed to enable operation in safe environment and prevent environmental pollution. Further, the metal film is formed in small thickness to be removed by chemical etching, whereby substantially no influence is exerted on lowering of the Q value.

The metal thin film can be easily etched to extremely reduce the processing time for the chemical etching in comparison with the conventional case, whereby the entire processing time for the metallization can be greatly reduced.

The heat treatment of the metal thin film is performed in order to react the metal with the ceramic surface thereby to strongly adhere the metal or metallic oxide onto the ceramic surface.

The present invention is optimally applied to formation of electrodes for a ceramic electronic component such as a dielectric resonator, while the same is also applicable to metallization of ceramics in general.

EXAMPLE

Cylindrical units of $ZrO_2$-$TiO_2$-$SnO_2$ ceramics were prepared, each being 11.0 mm in outer diameter, 3.9 mm in inner diameter and 26 mm in length. The ceramic units thus prepared were degreased and cleaned and the surfaces thereof were sensitized with a solution of stannous chloride and then activated through a solution of palladium chloride. Copper thin films of 0.04 μm to 0.8 μm in thickness (chemical analysis thickness) were formed on the ceramic units thus treated by electroless copper plating. After the copper plating, the respective units were subjected to heat treatment in an oxidizing atmosphere to oxidize the copper thin films. The heat treatment was performed under various temperatures within a range of 800° to 1200° C.

After the heat treatment, the respective units were degreased and rinsed and then dipped in a mixed aqueous solution of 4.8 percent by weight of $HNO_3$ and 2.8 percent by weight of HCl at a temperature of 60° C. for 9 minutes to perform etching. Thereafter the units were sensitized and activated.

Then, electroless copper plating was again performed to form copper films of 1 to 10 μm in thickness (chemical analysis thickness). Finally the plated units were subjected to heat treatment at a temperature of 600° C. for 30 minutes in a nitrogen air current.

Table 1 shows adhesion strength (Kg/mm) of the copper thin films formed on the surfaces of the units thus obtained.

TABLE 1

| | (Adhesion Strength) Unit: $Kg/mm^2$ | | | | |
| --- | --- | --- | --- | --- | --- |
| | *1 | | | | |
| *2 | 800° C. | 900 | 1000 | 1100 | 1200 |
| 0.04μ | 0.85 | 0.88 | *3 | *3 | *3 |
| 0.1μ | 0.93 | 1.03 | 1.08 | 0.95 | *3 |
| 0.3μ | 0.88 | 1.45 | 2.00 | 1.30 | 0.90 |
| 0.5μ | 0.33 | 1.00 | 1.83 | 1.45 | 0.73 |
| 0.8μ | 0.13 | 0.43 | 0.63 | 0.58 | 0.60 |

*1: heat treating temperature (°C.) previous to etching
*2: thickness of copper thin film formed previous to etching
*3: blistering - the term "blistering" indicates a state in which the thin film is expanded by containing gas or fluid in the inner side of the film.

The adhesion strength as shown in Table 1 was measured by soldering a lead wire to each thin film of 2×2 mm in area and pulling the lead wire by a tension tester.

It is seen that the adhesion strength is most increased when the copper-plated layer formed as a thin substrate layer in advance of etching is 0.3 μm in thickness and the temperature for heat treatment previous to etching is within a range of 900° to 1000° C. When the heat treatment is performed at a temperature higher than 1000° C., blistering may be caused on the surface depending on the thickness (in case of 0.04 μm) of the thin film formed previous to etching.

Table 2 shows electric characteristics of the respective units confirmed by measuring the Q values. The measuring frequency was 465 MHz.

TABLE 2

| | (Q Value) | | | | |
| --- | --- | --- | --- | --- | --- |
| | *1 | | | | |
| *2 | 800° C. | 900 | 1000 | 1100 | 1200 |
| 0.04μ | 648 | 695 | 680 | 639 | 620 |
| 0.1μ | 652 | 690 | 710 | 684 | 672 |
| 0.3μ | 667 | 726 | 736 | 724 | 693 |
| 0.5μ | 544 | 580 | 615 | 670 | 662 |
| 0.8μ | 396 | 420 | 524 | 600 | 488 |

*1, *2: identical to Table 1

It is seen from Table 2 that the Q value is most increased when the thin film serving as the substrate layer is 0.1 to 0.3 μm, particularly 0.3 μm in thickness. It is also seen that a unit of a higher Q value is obtained when the temperature for the heat treatment previous to etching is within a range of 900° to 1100° C., particularly at 1000° C.

Although an example of the present invention has been described in detail, it is clearly understood that the same is by way of illustration and example only and is not to be taken by way of limitation, the scope of the present invention being limited only by the terms of the appended claims.

What is claimed is:

1. A method of metallizing a ceramic material comprising:
    (a) forming a metal thin film on the surface of said ceramic material by electroless plating;
    (b) performing heat treatment in a temperature range of substantially 900° to 1200° C. on said ceramic surface having said metal thin film formed thereon;
    (c) chemically etching to remove said metal thin film; and
    (d) metallizing said ceramic surface by electroless plating after said etching.

2. A method of metallizing a ceramic material in accordance with claim 1, wherein said metal thin film formed by said electroless plating is 0.05 to 0.5 μm in thickness.

3. A method of metallizing a ceramic material in accordance with claim 1, wherein said ceramic material is prepared from $ZrO_2$-$TiO_2$-$SnO_2$ ceramics or $Al_2O_3$.

4. A method of metallizing a ceramic material in accordance with claim 1, wherein said metal thin film comprises copper and said heat treatment forms copper oxide.

5. A method of metallizing a ceramic material in accordance with claim 1, further comprising prior to step (a) the additional steps of:
    sensitizing the ceramic material surface with a solution of stannous chloride; and
    activating the ceramic material surface with a solution of palladium chloride.

6. A method of metallizing a ceramic material in accordance with claim 1, wherein said metallizing step (d) forms a copper film substantially 1-10 μm in thickness.

7. A method of metallizing a ceramic material in accordance with claim 2, wherein said metal thin film is chemically etched with an acid having low concentration.

8. A method of metallizing a ceramic material in accordance with claim 2, wherein said metal thin film is substantially 0.1 to 0.5 μm in thickness.

9. A method of metallizing a ceramic material in accordance with claim 8, wherein said metal thin film is substantially 0.3 μm in thickness.

10. A method of metallizing a ceramic material in accordance with claim 9, wherein said heat treatment is performed substantially at a temperature of 1000° C.

11. A method of metallizing a ceramic material in accordance with claim 7, wherein said metal thin film is chemically etched for less than substantially 10 minutes at a temperature lower than substantially 100° C. with an acid selected from the group consisting of dilute hydrochloric acid, dilute nitric acid, and an aqueous solution of hydrofluoric acid.

* * * * *